United States Patent
Hong et al.

(10) Patent No.: US 9,478,289 B1
(45) Date of Patent: Oct. 25, 2016

(54) SEMICONDUCTOR MEMORY DEVICE AND OPERATING METHOD THEREOF

(71) Applicant: SK hynix Inc., Gyeonggi-do (KR)

(72) Inventors: Yong Hwan Hong, Gyeonggi-do (KR); Byung Ryul Kim, Gyeonggi-do (KR); Dae Il Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/041,773

(22) Filed: Feb. 11, 2016

(30) Foreign Application Priority Data

Sep. 10, 2015 (KR) .......................... 10-2015-0128396

(51) Int. Cl.
  G11C 15/02 (2006.01)
  G11C 16/06 (2006.01)
  G11C 15/04 (2006.01)
(52) U.S. Cl.
  CPC ..................................... *G11C 15/04* (2013.01)
(58) Field of Classification Search
  CPC ..... G11C 15/00; G11C 15/04; G11C 15/043; G11C 15/046; G11C 2213/77; G11C 16/06; G11C 16/349
  See application file for complete search history.

(56) References Cited

U.S. PATENT DOCUMENTS

| 2015/0109841 A1* | 4/2015 | Lim | G11C 16/102 365/49.1 |
| 2015/0235702 A1* | 8/2015 | Mun | G11O 5/02 365/49.1 |

FOREIGN PATENT DOCUMENTS

| KR | 1020110078730 | 7/2011 |
| KR | 1020120126031 | 11/2012 |

\* cited by examiner

*Primary Examiner* — Hien Nguyen
(74) *Attorney, Agent, or Firm* — IP & T Group LLP

(57) ABSTRACT

A semiconductor memory device includes a column address generation circuit suitable for generating contents addressable memory (CAM) column addresses for duplicated CAM data, a column selection circuit suitable for allocating columns to the duplicated CAM data according to the CAM column addresses, and a plurality of page buffer units, each unit being coupled to a corresponding memory group through the allocated columns, and suitable for storing the duplicated CAM data in the memory groups through the allocated columns. The allocated columns are of arranged sequentially within each memory group in a circular order, and a part of the CAM column addresses represent columns which are physically apart by a predetermined number of columns within a memory group.

20 Claims, 6 Drawing Sheets

SEMICONDUCTOR MEMORY DEVICE AND OPERATING METHOD THEREOF

CROSS-REFERENCE TO RELATED APPLICATION

The present application claims priority to Korean patent application number 10-2015-0128396, filed on Sep. 10, 2015, the entire disclosure of which is incorporated herein in its entirety by reference.

BACKGROUND

1. Field of Invention

Various embodiments of the present invention relate to an electronic device, and more particularly, to a semiconductor memory device and an operating method thereof.

2. Description of Related Art

Semiconductor memory devices can be largely classified into volatile memory devices and nonvolatile memory devices.

Nonvolatile memory devices have a relatively slow writing and reading speed but can retain the data stored even if the power is turned off. Therefore, nonvolatile memory devices may be used to store data that must be retained regardless of the status of the power supply. Examples of nonvolatile memory devices include a read only memory (ROM), a Mask ROM (MROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), and a ferroelectric RAM (FRAM).

Besides retaining their stored data when power is turned off, flash memory devices also have also the advantage of allowing data or programs stored therein to be readily erased. Flash memory devices are widely used as storage media for portable electronic devices, such as digital cameras, Personal Digital Assistants (PDAs) and MP3 players. Flash memory devices may be classified into NOR and NAND type flash memory devices.

SUMMARY

A purpose of the invention is to provide a semiconductor memory device which provides improved capable of reliably storing contents addressable memory (CAM) data, and an operating method thereof.

According to an embodiment of the invention, there is provided a semiconductor memory device including a column address generation circuit. The column address generation circuit is suitable for generating contents addressable memory (CAM) column addresses for duplicated CAM data. The semiconductor memory device further includes a column selection circuit suitable for allocating columns to the duplicated CAM data according to the CAM column addresses. The memory device further includes a plurality of page buffer units, each unit being coupled to a corresponding memory group through the allocated columns, and suitable for storing the duplicated CAM data in the memory groups through the allocated columns, wherein the allocated columns are of arranged sequentially within each memory group in a circular order. A part of the CAM column addresses represent columns which are physically apart by a predetermined number of columns within a memory group.

According to another embodiment of the present invention, there is provided an operating method for a semiconductor memory device including a plurality of page buffer units each unit corresponding to a memory group of a plurality of memory groups through columns, the method including: generating duplicated contents addressable memory (CAM) column addresses for CAM data pieces; allocating the columns to the duplicated CAM data pieces according to the CAM column addresses; and storing duplicated CAM data pieces in the memory groups through the allocated columns, wherein each of the page buffer units is coupled to a corresponding memory group via the allocated columns which are sequentially allocated to each memory group in a circular order, and wherein a part of the CAM column addresses corresponding to one of the memory groups represent allocated columns which are physically apart by a predetermined number of columns from one another among the columns.

According to aforementioned various embodiments of the present invention, it is possible to improve the reliability of CAM data by allocating column addresses for the CAM data such that duplicated CAM data are stored in physically separated memory areas during a program operation to the CAM data.

BRIEF DESCRIPTION OF THE DRAWINGS

The above and other features and advantages of the invention will become more apparent to those of ordinary skill in the art after having read the following description of embodiments of the invention with reference to the attached drawings in which.

DETAILED DESCRIPTION

Figure 1:
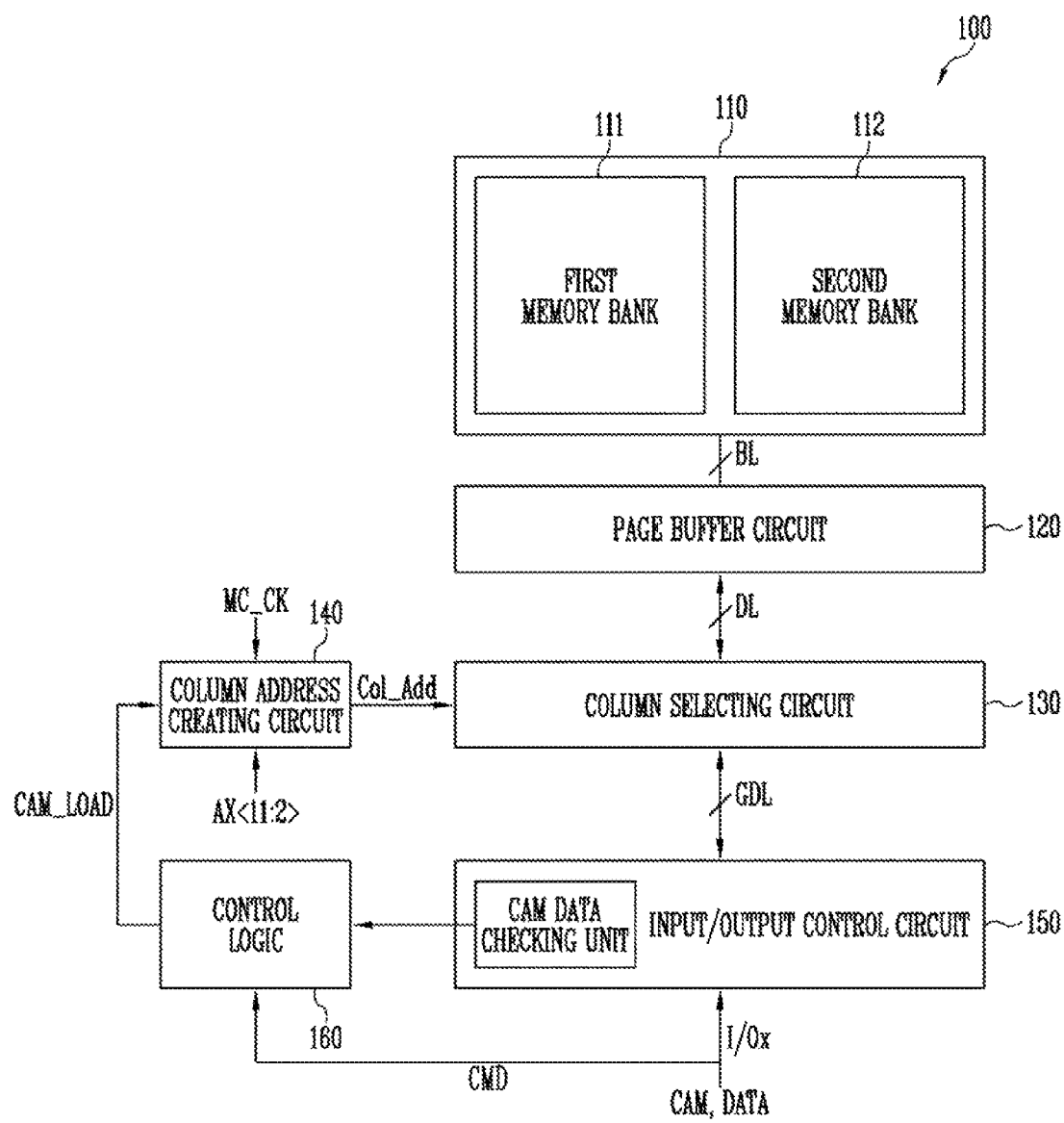
FIG. 1 is a block diagram illustrating a semiconductor memory device, according to an embodiment of the present invention.

Hereinafter, various embodiments of the present invention will be described in greater detail with reference to the accompanying drawings. It should be understood, however, that the invention may be embodied in different forms and should not be construed as being limited to the embodiments set forth herein. Moreover, the drawings are simplified illustrations and may not be drawn to scale and, in some instances, proportions may have been exaggerated in order to illustrate certain features of the embodiments. Thus the embodiments should not be construed as being limited to the particular shapes illustrated herein but may include deviations in shapes that result, for example, from manufacturing. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present invention. Furthermore, 'and/or' may include any one of or a combination of the components mentioned.

Furthermore, 'connected/accessed' as used herein represents that one component is directly connected or accessed to another component or indirectly connected or accessed through another component.

In this specification, a singular form may include a plural form as long as it is not specifically mentioned in a sentence. Furthermore, 'include/comprise' or 'including/comprising' used in the specification represents that one or more components, steps, operations, and elements exist or are added.

Furthermore, unless defined otherwise all the terms used in this specification including technical and scientific terms have the same meanings as would be generally understood by those skilled in the related art.

Referring now to FIG. 1, a semiconductor memory device denoted generally with numeral 100 is provided, according to an embodiment of the invention.

The semiconductor memory device 100 includes a memory cell array 110, a page buffer circuit 120, a column selection circuit 130, a column address generation circuit 140, an input/output control circuit 150, and a control logic 160.

The memory cell array 110 may include one or more planes, although in the embodiment shown herein, explanation of the functioning of the memory cell array will be made based on an example of the memory cell array 110 that includes one plane.

Figure 2:
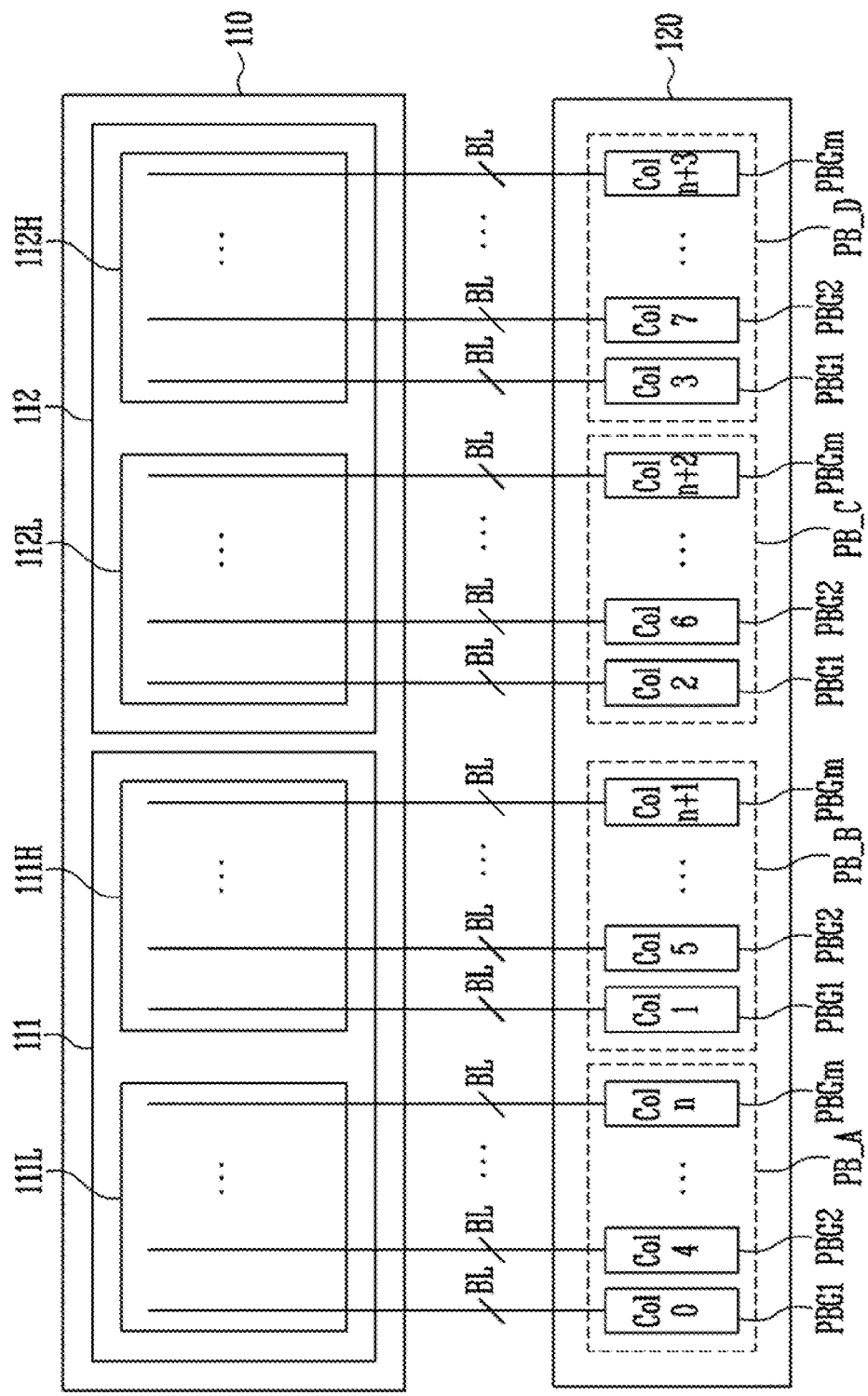
FIG. 2 is a schematic view illustrating a column address that corresponds to a memory cell array and a page buffer circuit for a memory device, according to an embodiment of the present invention.

The memory cell array 110 includes plurality of memory banks 111 and 112. Each of the plurality of memory banks 111 and 112 includes a plurality of memory cells and a plurality of CAM cells. Although only two memory banks are shown in the embodiment of FIG. 2, it should be understood that the memory cell array 110 may comprise any suitable number of memory banks. In an embodiment, the plurality of memory cells are nonvolatile memory cells, and more particularly, the plurality of memory cells may be nonvolatile memory cells that are based on a charge trap device. The plurality of memory cells may store normal data and the plurality of CAM cells may store CAM data.

The page buffer circuit 120 is connected to the memory cell array 110 through a plurality of bit lines BL. The page buffer circuit 120 may adjust potential levels of the plurality of bit lines BL according to the normal data or the CAM data temporarily stored during the program operation, and may sense potential levels or amounts of current of the plurality of bit lines BL during a read operation so as to read the data stored in the memory cells or CAM cells of the memory cell array 110.

The page buffer circuit 120 includes a plurality of page buffers, each page buffer corresponding to one bit line or one pair of bit lines.

During a program operation, the column selection circuit 130 may transmit normal data or CAM data, which is sent through a global data line GDL, to one of a plurality of data lines DL according to a column address Col_Add.

Furthermore, during a read operation, the column selection circuit 130 may receive data corresponding to the column address Col_Add among the plurality of data temporarily stored in the page buffer circuit 120, and may output the received data to the global data line GDL.

The column address generation circuit 140 may generate the column address Col_Add for one of the normal data and the CAM data in response to a CAM data control signal CAM_LOAD, which is enabled during the program or read operation to the CAM data. For example, when the CAM data control signal CAM_LOAD is enabled, the column address generation circuit 140 generates the column address Col_Add for the CAM data, and when the CAM data control signal CAM_LOAD is disabled, the column address generation circuit 140 generates the column address Col_Add for the normal data.

During the program or read operation to the CAM data, the column address generation circuit 140 may generate the column address Col_Add based on an address signal (AX<11:2>) such that selected columns of the memory cell array 110 are physically spaced from one another by a certain distance according to the column address Col_Add. During the program or read operation to the normal data, the column address generation circuit 140 generates a column address Col_Add based on the address signal (AX<11:2>) such that it increases sequentially. The column address generation circuit 140 is synchronized with a clock signal MC_CK and generates the column address Col_Add by performing a counting operation.

The input/output control circuit 150 receives CAM data CAM or normal data DATA through an input/output line I/Ox during the program operation, and transmits the CAM data or normal data to the global data line CDL. The input/output control circuit 150 includes a CAM data checking unit 151.

The CAM data stored in the CAM cells of the memory cell array 110 is the main information on the semiconductor device, and thus reliability of the CAM data is most important. For this purpose, CAM data is duplicated to a plurality of duplicated CAM data by the input/output control circuit 150, and the duplicated CAM data may be programmed in the CAM cell. During the read operation to the CAM data, the duplicated CAM data may be restored back to the original CAM data by the CAM data checking unit 151.

That is, the input/output control circuit 150 may duplicate the original CAM data into a plurality of duplicated CAM data each having the same data value as the original CAM data. During a read operation to the CAM data, the input/output control circuit 150 may determine a majority value for the read values of the duplicated CAM data and define the majority value as the value of the original CAM data and output the same when the number of occurrences of the majority value is greater than a predetermined value. On the other hand, if the number of occurrences of the majority value is less than a predetermined value then the input/output control circuit 150 may define the majority value for the read values of the duplicated CAM data as a CAM data error.

The control logic 160 may control overall operations of the semiconductor memory device 100 in response to a command CMD provided through the input/output line I/Ox. During the program or read operation to the CAM data, the control logic 160 enables the CAM data control signal CAM_LOAD.

The control logic 160 controls the memory cell array 110, page buffer circuit 120, column selection circuit 130, column address generation circuit 140, and input/output control circuit 150 to read the CAM data stored in the memory cell array 110 during an initial operation of the semiconductor memory device 100 and then performs the overall operations of the semiconductor memory device 100 according to the read CAM data.

FIG. 2 is a schematic view illustrating a column address that corresponds to the memory cell array 110 and the page buffer circuit 120 of FIG. 1.

For example, the memory cell array 110 may include a first memory bank 111 and a second memory bank 112. The first memory bank 111 may include a low byte bank 111L and high byte bank 111H, and the second memory bank 112 may include a low byte bank 112L and a high byte bank 112H.

For example, the low byte bank 111L and high byte bank 111H of the first memory bank 111 and the low byte bank 112L and high byte bank 112H of the second memory bank 112 may be sequentially arranged as illustrated in the drawings.

In an embodiment of the present invention, each of the low byte bank 111L and the high byte bank 111H of the first memory bank 111 and the low byte bank 112L and the high byte bank 112H of the second memory bank 112 may be defined as a single physical memory group. For example, FIG. 2 shows the memory cell array 110 including four physical memory groups.

The page buffer circuit 120 includes a plurality of page buffer units PB_A, PB_B, PB_C and PB_D respectively corresponding to the physical memory groups 111L, 111H, 112L, and 112H of the memory cell array 110. Each page buffer unit includes a plurality of page buffer groups PBG1 to PBGm.

For example, the page buffer unit PB_A that corresponds the low byte bank 111L of the first memory bank 111 includes a plurality of page buffer groups PBG1 to PBGm, and each page buffer group PBG1 to PBGm corresponds to one column. For example, page buffer group PBG1 corresponds to column Col 0, page buffer group PBG2 corresponds to column Col 4, and page buffer group PBGm corresponds to column Col n.

Referring to FIG. 2, entire columns Col 0 to Col n+3 are sequentially allocated to the physical memory groups 111L, 111H, 112L, and 112H of the memory cell array 110 in a circular order. Thus, each of the physical memory groups 111L, 111H, 112L, and 112H corresponds to a plurality of columns allocated to each memory group sequentially in a circular order. Hence, for the embodiment of FIG. 2 having four memory groups, the first four columns Col 0 to Col 4 are allocated sequentially to the four memory groups with the first Col 0 allocated to the first memory group 111L, the second column Col 1 to the second memory group 111H, the third column COL 2 to the third memory group 112L, and the fourth column to the fourth memory group 112H. The next four columns are allocated in the same manner starting from the first memory group and continuing in a sequential manner to the last memory group and then so on and so forth in a sequential, cyclical manner allocating all remaining columns to the four memory groups, for example, columns Col 0, Col 4, to Col n with the number of each column being incremented by an increment of four (the number of the memory groups), starting from the first column Col 0 are allocated to the first low byte bank 111L of the first memory bank 111; sequential columns Col 1, Col 5 to Co n+1, starting with the second column followed by columns having a column number incremented with the increment of four are allocated to the high byte bank 111H of the first memory bank 111; sequential columns Col 2, Col 6 and Col n+2, starting with the third column Col 2 followed by columns having column number incremented with the increment of four are allocated to the low byte bank 112L of the second memory bank 112; and columns Col 3, Col 7 and Col n+3 starting with the third column Col 3 followed by columns having a column number incremented with the increment of four are allocated to the high byte bank 112H of the second memory bank 112.

Therefore, during a program operation to the CAM data, in a case of programming the CAM data by duplicating the original CAM data into a plurality of duplicated CAM data (for example, eight duplicated CAM data) and then allocating the duplicated CAM data respectively into the first to eighth columns Col 0 to Col 7 in simple sequential order, the duplicated CAM data may be allocated to adjacent columns. Referring to FIG. 2, the first and fifth columns Col 0 and Col 4 are adjacent to each other, the second and sixth columns Col 1 and Col 5 are adjacent to each other, the third and seventh columns Col 2 and Col 6 are adjacent to each other, and the fourth and eighth columns Col 3 and Col 7 are adjacent to each other. When there occurs a process error between the adjacent columns, the duplicated CAM data allocated to the adjacent columns in the simple sequential order may be processed erroneously.

In accordance with an embodiment of the present invention, even if a process error occurs in a column, the error will not affect the adjacent column thereby improving the reliability of the CAM data.

Figure 3:
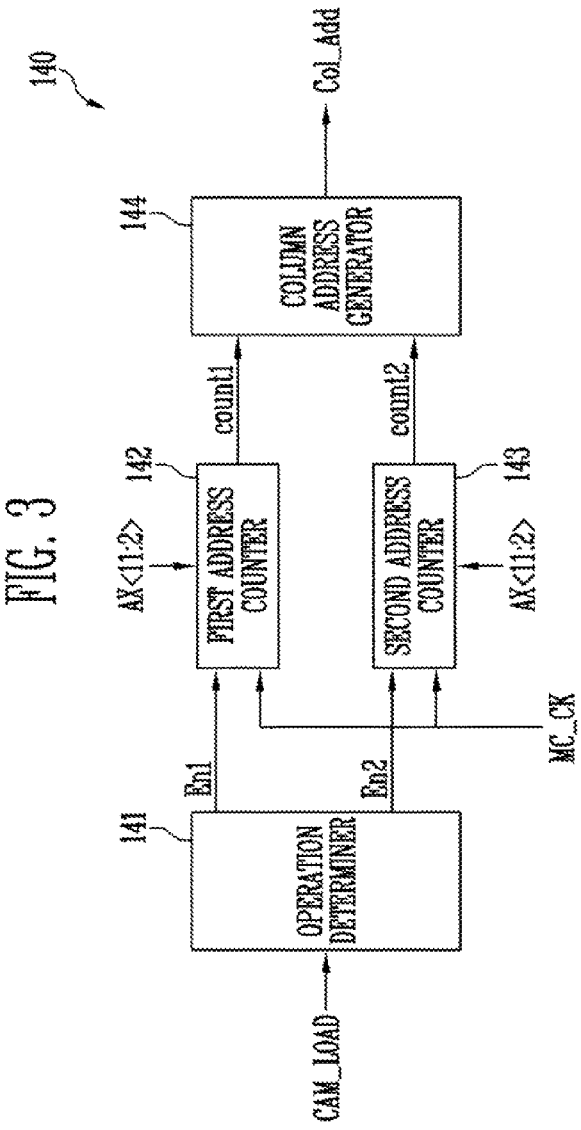
FIG. 3 is a block diagram illustrating a column address generation circuit for a memory device, according to an embodiment of the present invention.

FIG. 3 is a block diagram of a column address generation circuit 140 suitable for the memory device 100 of FIG. 1, according to an embodiment of the invention Referring now to FIG. 3, the column address generation circuit 140 includes an operation determiner 141, a first address counter 142, a second address counter 143, and a column address generator 144.

The operation determiner 141 determines whether a current operation is a program or read operation to CAM data or normal data based on a CAM data control signal CAM_LOAD and outputs a first or second enable signal En1, En2, according to the determination. For example, if the current operation is of a program or read operation to normal data as determined by a disabled CAM data control signal CAM_LOAD, the operation determiner 141 enables the first enable signal Ent. If the current operation is a program or read operation to CAM data as determined by an enabled CAM data control signal CAM_LOAD, the operation determiner 141 enables the second enable signal En2.

During a program or read operation to normal data, the first address counter 142 is activated in response to the first enable signal En1 and outputs a first count signal count 1 representing normal column addresses increasing sequentially based on the address signal AX 11:2>. For example, the first address counter 142 counts a lowest bit AX<2> among the address signals AX<11:2> and outputs the first count signal count 1 representing the normal column addresses sequentially increasing. The normal column addresses correspond to the column address Col_Add for the normal data, as described with reference to FIG. 1.

During a program or read operation to CAM data as determined by an enabled CAM data control signal CAM_LOAD, the second address counter 143 is activated in response to the second enable signal En2, and outputs a second count signal count 2. The second count signal count2 represents first and second groups of CAM column addresses based on the address signal AX<11:2>. Each of the first and second groups of CAM column addresses includes the column addresses sequentially increasing and respectively corresponding to the physical memory groups while the first and second groups of CAM column addresses are separated by a predetermined number of columns. The CAM column addresses correspond to the column address Col_Add for the CAM data, as described with reference to FIG. 1. For example, the second address counter 143 counts the lowest bit AX<2> among the address signal AX<11:2>, and outputs the second count signal count 2 representing the first group of CAM column addresses sequentially increasing and respectively corresponding to the physical memory groups 111L, 111H, 112L, and 112H, and when an upper bit AX<11> is 1, outputs the second count signal count 2 representing the second group of CAM column addresses sequentially increasing and respectively corresponding to the physical memory groups 111L, 111H, 112L, and 112H while the first and second groups of CAM column addresses are separated by the predetermined number of columns. The upper bit AX<11> is an address signal that corresponds to the low byte bank 111L and 112L or the high byte bank 111H and 112H in one memory bank 111 and 112, respectively.

In an embodiment of the present invention, the memory cell array 110 includes four physical memory groups 111L, 111H, 112L, and 112H as an example. Therefore, the second address counter 143 outputs the second count signal count 2 counting 0 to 3 representing four CAM column addresses as the first group of CAM column addresses sequentially increasing and respectively corresponding to the physical memory groups 111L, 111H, 112L, and 112H, and then outputs the second count signal count 2 counting 2048 to 2501 representing another four CAM column addresses as the second group of CAM column addresses sequentially increasing and respectively corresponding to the physical memory groups 111L, 111H, 112L, and 112H while the first and second groups of CAM column addresses are separated by the predetermined number of columns. The predetermined number is preferably one half of the number of the plurality of columns included in one physical memory group. For example, each of the physical memory groups 111L, 111H, 112L, and 112H may correspond to 4096 columns and thus the predetermined number of columns may be 2048. Accordingly, the second address counter 143 may output the second count signal count 2 counting 0 to 3 representing four CAM column addresses as the first group of CAM column addresses, and then outputs the second count signal count 2 counting 2048 to 2501 representing another four CAM column addresses as the second group of CAM column addresses.

The column address generation unit 144 outputs a column address Col_Add corresponding to a first or second count signal count 1 and count 2, which are generated by the first and second address counter 142 and 143 during a program or read operation to the normal data or the CAM data respectively. During a program or read operation to normal data, the column address generation unit 144 generates a column address Col_Add or the normal column address corresponding to a first count signal count 1 for the normal data that sequentially increases. During a program or read operation to CAM data, the column address generation unit 144 generates a column address Col_Add, or more particularly the first and second groups of CAM column addresses, corresponding to the second count signal count 2 for the CAM data. As described above, each of the first and second groups of CAM column addresses includes the column addresses sequentially increasing and respectively corresponding to the physical memory groups 111L, 111H, 112L, and 112H while the first and second groups of CAM column addresses are separated by the predetermined number (i.e., 2048) of the column address.

Figure 4:
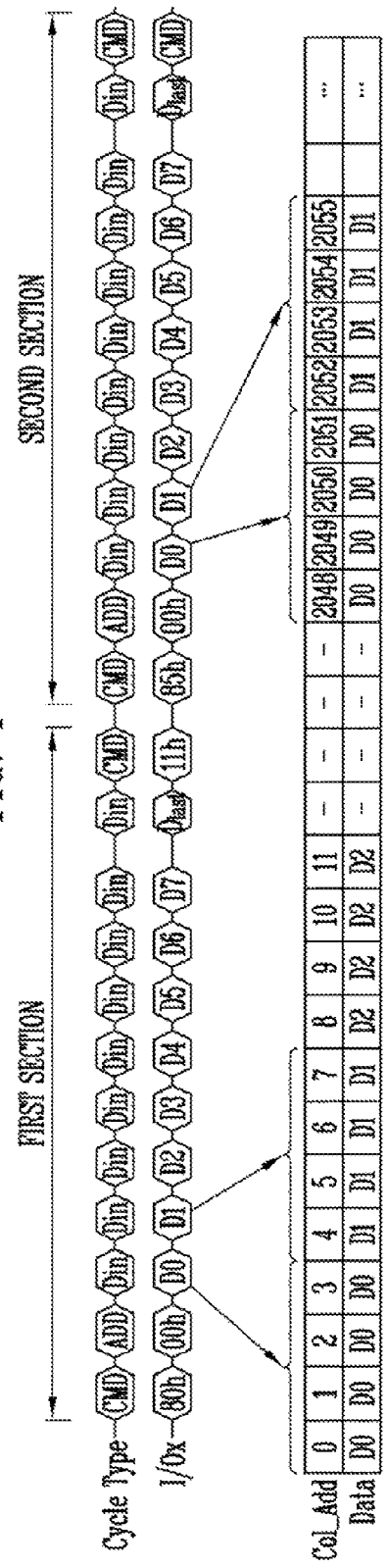
FIG. 4 is a data sequence illustration of a program operation of a memory device, according to an embodiment of the present invention.
Figure 5:
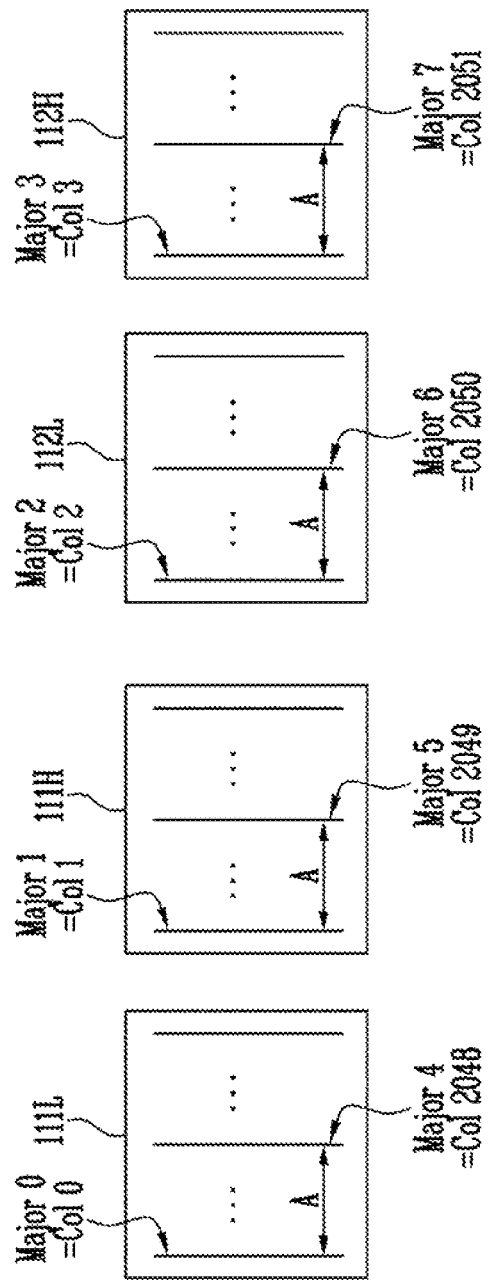
FIG. 5 is a schematic view illustrating a column address of CAM data, according to an embodiment of the present invention.

FIG. 4 is a data sequence illustrating a program operation to CAM data of a semiconductor memory device 100, according to an embodiment of the present invention FIG. 5 is a schematic view illustrating the column address of the CAM data according to an embodiment of the invention.

Hereinafter, program operations to normal data and to CAM data of the semiconductor memory device 100, according to an embodiment of the invention will be explained with reference to FIGS. 1 to 5.

Program Operation to Normal Data

During a program operation to normal data, the CAM data control signal CAM_LOAD is disabled. Therefore, the operation determiner 141 of the column address generation circuit 140 enables a first enable signal En1. The second enable signal En2 is disabled. The first address counter 142 is activated in response to the enabled first enable signal En1, and outputs a first count signal count 1 that sequentially increases according to the address signal AX<11:2>.

The column address generator 144 generates a column address Col_Add or a normal column address corresponding to the first count signal count 1 for the normal data that sequentially increases. The column address generator 144 generates the column address Col_Add that sequentially increases by increments of one at a time from an initial first column address Col 0 according to the first count signal count 1.

The input/output control circuit 150 receives the normal data DATA through the input/output line I/Ox and transmits the received normal data to the global data line GDL.

The column selection circuit 130 transmits the normal data DATA in the data line DL according to the column addresses Col_Add that sequentially increase by an increment of one at a time from the column address.

The plurality of normal data DATA are then transmitted to and temporarily stored in a plurality of corresponding page buffer groups PBG1 to PBGm of the page buffer circuit 120 that correspond to each allocated column address Col_Add. The plurality of page buffer groups PBG1 to PBGm adjust the potential levels of the bit lines BL according to the data value of the stored normal data DATA, thereby programming the normal data DATA in the memory cells of the memory cell array 110.

As described above, the columns are allocated to the plurality of normal data DATA according to the column address Col_Add that sequentially increases. Therefore, the plurality of normal data DATA are distributed over and temporarily stored in the plurality of page buffer groups PBG1 to PBGm of the plurality of page buffer units PB_A, PB_B, PB_C and PB_D exemplified in FIG. 2, and then programmed in the corresponding memory cells.

Program Operation to Cam Data

Hereinafter, explanation of a program operation to CAM data will be made with an example of eight duplicated CAM data. First four and last four duplicated CAM data may be programmed during first and second sections according to the first and second groups of CAM column addresses, respectively.

When a command CMD represented by "80h" and an initial address ADD represented by "00h" for a program operation to CAM data are input through the input/output line I/Ox in a first section, the control logic 160 enables the CAM data control signal CAM_LOAD.

When a plurality of CAM data D0 to Dlast are sequentially input through the input/output line I/Ox, the input/output control circuit 150 duplicates each CAM data D0 to Dlast into a plurality of duplicated CAM data. For example, the original CAM data D0 is duplicated to eight duplicated CAM data Major 0 to Major 7 as shown in FIG. 5.

The operation determiner 141 of the column address generation circuit 140 enables the second enable signal En2 and disables the first enable signal En1 in response to the enabled CAM data control signal CAM_LOAD. The second address counter 143 is activated in response to the enabled second enable signal En2, outputs the second count signal count 2 based on the address signal AX<11:2>, and the column address generator 144 generates the column address Col_Add in response to the second count signal count 2. The column address generator 144 generates the column address Col_Add or the first group of CAM column addresses Col 0 to Col 3 corresponding to the second count signal count 2 for the CAM data. As described above, the first group of CAM column addresses Col 0 to Col 3 includes the column addresses Col 0 to Col 3 sequentially increasing and respectively corresponding to the physical memory groups 111L, 111H, 112L, and 112H.

Then, when a command CMD represented by "85h" and initial address ADD represented by "00h" for the program operation to the CAM data are input through the input/output line I/Ox in the second section, the control logic 160 enables the CAM data control signal CAM_LOAD.

Accordingly, the operation determiner 141 of the column address generation circuit 140 enables the second enable signal En2 in response to the enabled CAM data control signal CAM_LOAD. The second address counter 143 is activated in response to the enabled second enable signal En2, and outputs the second count signal count 2 based on the address signal AX<11:2>, and the column address generator 144 generates the column address Col_Add or the second group of CAM column addresses Col 2048 to Col 2051 corresponding to the second count signal count 2 for the CAM data. As described above, each of the first and second groups of CAM column addresses includes the column addresses sequentially increasing and respectively corresponding to the physical memory groups 111L, 111H, 112L, and 112H while the first and second groups of CAM column addresses are separated by the predetermined number (i.e., 2048) of the column address.

For example, the column selection circuit 130 allocates the plurality of duplicated CAM data (e.g., the duplicated CAM data Major 0 to Major 7 shown in FIG. 5), which are sequentially input through the global data line GDL, to the first column addresses Col 0 to Col 3 and second column addresses Col 2048 to Col 2051, and transmits first half and second half of the plurality of duplicated CAM data to the page buffer circuit 120 through the data line DL according to the first and second groups of CAM column addresses during the first and second section, respectively. That is, the column selection circuit 130 may allocate and, distribute the plurality of duplicated CAM data (e.g., the duplicated CAM data Major 0 to Major 7 corresponding to the original CAM data D0 as shown in FIG. 5) for each of the original CAM data D0 to Dlast according to the first and second groups of CAM column addresses (e.g., column addresses Col 0 to Col 3 as the first group of CAM column addresses and column addresses Col 2048 to Col 2055 as the second group of CAM column addresses, each for the first half and second half of eight duplicated CAM data Major 0 to Major 7) each including the column addresses sequentially increasing and respectively corresponding to the physical memory groups while the first and second group of CAM column addresses are separated by the predetermined number (i.e., 2048) of the column address.

The plurality of duplicated CAM data are transmitted to and temporarily stored in the plurality of page buffer groups PBG1 to PBGm of the page buffer circuit 120 that corresponds to each allocated column address Col_Add, and the potential levels of the bit lines BL are adjusted according to the data value of the stored CAM data CAM and the data is programmed in the CAM cells of the memory cell array 110.

The plurality of CAM data CAM are allocated with columns according to the first and second groups of CAM column addresses each including the column addresses sequentially increasing and respectively corresponding to the physical memory groups while the first and second groups of CAM column addresses are separated by the predetermined number (i.e., 2048) of the column address.

Therefore, as illustrated in FIG. 5, column addresses are allocated according to the first group of CAM column addresses such that a first duplicated CAM data Major 0 corresponds to the column address Col 0, a second duplicated CAM data Major 1 corresponds to the column address Col 1, a third duplicated CAM data Major 2 corresponds to the column address Col 2, and a fourth duplicated CAM data Major 3 corresponds to the column address Col 3, and are programmed to each of the physical memory groups 111L, 111H, 112L, and 112H. Furthermore, the column addresses are allocated according to the second group of CAM column addresses such that a fifth duplicated CAM data Major 4 corresponds to the column address Col 2048, a sixth duplicated CAM data Major 5 corresponds to the column address Col 2049, a seventh duplicated CAM data Major 6 corresponds to the column address Col 2050, and an eighth duplicated CAM data Major 7 corresponds to the column address Col 2051, and are programmed to each of the physical memory groups 111L, 111H, 112L, and 112H.

A distance (indicated by "A" in FIG. 5) from the columns Col 0 to Col 3 corresponding to the first group of CAM column addresses for the first one half of the plurality of the duplicated CAM data and the columns Col 2048 to Col 2051 corresponding to the second group of CAM column addresses for the second one half of the plurality of the duplicated CAM data represents the predetermined number (i.e., 2048) of the column address.

Therefore, even if a process error occurs in the columns, the error will not affect an adjacent column, thereby improving the reliability of the CAM data.

Figure 6:
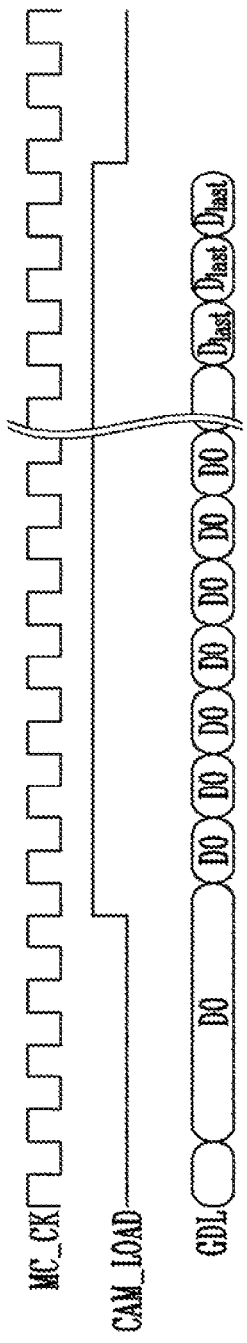
FIG. 6 is a waveform diagram illustrating a read operation of a memory device, according to an embodiment of the present invention.

FIG. 6 is a waveform diagram illustrating a read operation to CAM data of a semiconductor memory device 100, according to an embodiment of the invention.

Hereinafter, a read operation to CAM data will be explained with reference to FIGS. 1 to 3 and 6.

During a read operation to CAM data, the CAM data control signal CAM_LOAD is enabled. Therefore, the column address generation circuit 140 generates the column address Col_Add in the same way as in the aforementioned described program operation to CAM data. Accordingly, the column selection circuit 130 transmits read values of the plurality of duplicated CAM data (e.g., Major 0 to Major 7 as shown in FIG. 5) corresponding to the original CAM data (e.g., D0) from the plurality of page buffer groups PBG1 to PBGm to the input/output control circuit 150 through the data line DL and the global data line GDL according to the column address Col_Add or more particularly, the first and second groups of CAM column addresses.

The CAM data checking unit 151 of the input/output control circuit 150 restores the original CAM data based on the read value of the plurality of duplicated CAM data. As described above, the original CAM data is duplicated to a plurality of duplicated CAM data by the input/output control circuit 150, and the plurality of duplicated CAM data are programmed in the CAM cell during the program operation to the CAM data. During the read operation to the CAM data, the input/output control circuit 150 determines the majority value for the read values of the duplicated CAM data as the value of the original CAM data and outputs the same when the number of occurrences of the majority value is greater than a predetermined value (for example, six). On the other hand, the input/output control circuit 150 determines the majority value to be a CAM data error when the number of occurrences of the majority value is less than the predetermined value. For example, in a case where the read value of the plurality of duplicated CAM data consist of seven "0" data and a single "1", the value "0" is determined as the original CAM data. Furthermore, in a case where the read value of the plurality of duplicated CAM data consist of five "0" and three "1", the number of occurrences of the majority value "0" is less than the predetermined number (for example, six), the input/output control circuit 150 determines the majority value for the read values of the duplicated CAM data as a CAM data error.

The CAM data restored through the CAM data checking unit 151 is transmitted to the control logic 160, and the control logic 160 is stored in a register inside the CAM data, and then used for the overall operation of the semiconductor memory device 100.

The invention allows mapping column addresses that corresponds to CAM data such that columns are physically spaced from one another, thereby improving the reliability of the CAM data.

Hereinafter, a normal data read operation of a semiconductor memory device according to the invention will be explained with reference to FIGS. 1 to 3.

During a read operation to the normal data, the CAM data control signal CAM_LOAD is disabled. Therefore, the column address generation circuit 140 generates column address Col_Add that sequentially increases in the same way as the aforementioned program operation to the normal data, and the column selection circuit 130 transmits read normal data from the plurality of page buffer groups PBG1 to PBGm to the input/output control circuit 150 through the data line DL and the global data line GDL according to the column address Col_Add or the normal column addresses that sequentially increase.

The input/output control circuit 150 may output the data of number bytes received through the global data line GDL to an external device.

Figure 7:
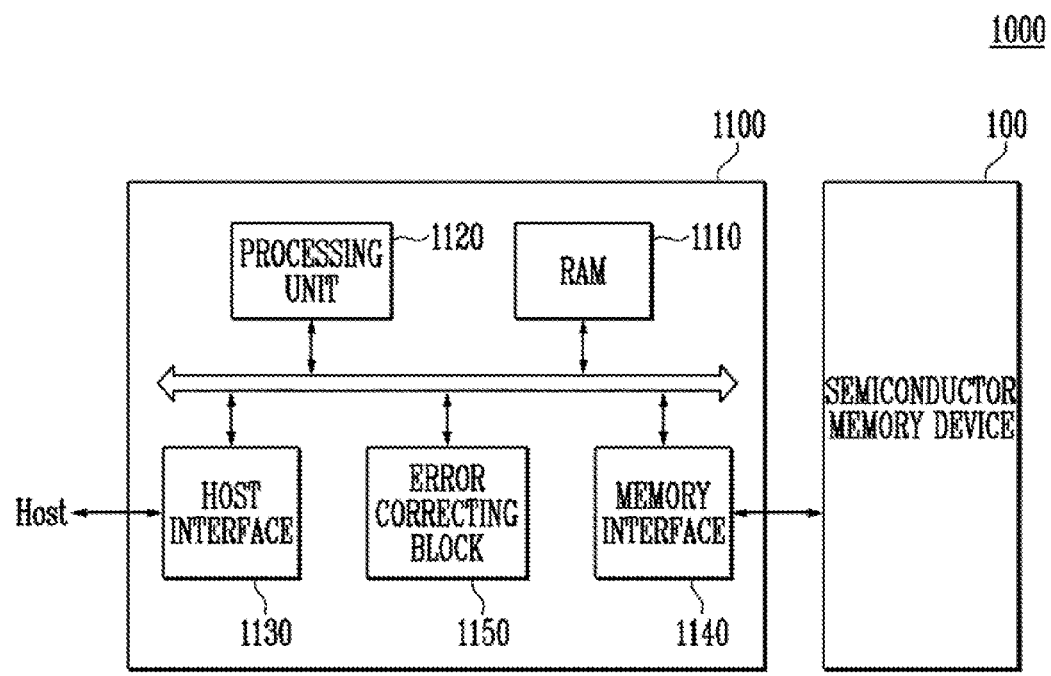
FIG. 7 is a block diagram illustrating a memory system that includes a memory device, according to an embodiment of the present invention.

FIG. 7 is a block diagram illustrating a memory system including a semiconductor memory device 100 of FIG. 1, according to an embodiment of the invention.

Referring to FIG. 7, a memory system 1000 includes a semiconductor memory device 100 and a controller 1100.

The semiconductor memory device 100 may be configured and operated in the same manner as explained with reference to FIG. 1. Hereinafter, repeated explanation will be omitted.

The controller 1100 is connected to a host and the semiconductor memory device 100. The controller 1100 is may access the semiconductor memory device 100 in response to a request from the host. For example, the controller 1100 may control a read, write, delete and background operations of the semiconductor memory device 100. The controller 1100 may provide an interface between the semiconductor memory device 100 and host. The controller 1100 may drive a firmware for controlling the semiconductor memory device 100.

The controller 1100 may include a RAM (Random Access Memory) 1110, a processing unit 1120, a host interface 1130, a memory interface 1140, and an error correcting block 1150. The RAM 1110 may be used as at least one of a cache memory between an operating memory, semiconductor memory device 100, and a buffer memory between the semiconductor memory device 100 and host. The processing unit 1120 may control the overall operations of the controller 1100. Furthermore, the controller 1100 may temporarily store the program data provided from the host during a writing operation.

The host interface 1130 may include a protocol for performing data exchange between the host and controller 1100. In an embodiment, the controller 1200 may communicate with the host through at least one of various interface protocols such as a USB (Universal Serial Bus) protocol, MMC (multimedia card) protocol, PCI (peripheral component interconnection) protocol, PCI-E (PCI-express) protocol, ATA (Advanced Technology Attachment) protocol, Serial-ATA protocol, Parallel-ATA protocol SCSI (small computer small interface) protocol, ESDI (enhanced small disk interface) protocol, and IDE (Integrated Drive Electronics) protocol, and private protocol.

The memory interface 1140 may perform interfacing with the semiconductor memory device 100. For example, the memory interface may include a NAND interface or NOR interface.

The error correcting block 1150 may detect and correct an error of the data received from the semiconductor memory device 100 using an ECC (Error Correcting Code). The processing unit 1120 may control the semiconductor memory device to adjust a reading voltage and to perform a re-reading according to a result of error detection of the error correcting block 1150. In an embodiment, the error correcting block may be provided a s a component of the controller 1100.

The controller 1100 and semiconductor memory device 100 may be integrated as one semiconductor memory device 100, and form a memory card. For example, the controller 1100 and semiconductor memory device 100 may be integrated as one semiconductor device, and form a memory card such as a PCMCIA (Personal Computer Memory Card International Association), CF (Compact Flash Card), SM or SMC (Smart Media Card), memory stick, MMC, RS-MMC, or MMCmicro (Multimedia Card), SD miniSD, microSD, SDHC (SD Card) and UFS (Universal Flash Memory Device) and the like.

The controller 1100 and semiconductor memory device 100 may be integrated as one semiconductor device and form an SSD (Solid State Driver). The SSD includes a storage device that may store data in the semiconductor memory. In a case where the memory system 1000 is used as an SSD, the operating speed of the host connected to the memory system 2000 may significantly improve.

In another example, the memory system 1000 is provided as one of various components of a computer, UMPC (Ultra Mobile PC), workstation, net-book, PDA (Personal Digital Assistant), portable computer, web tablet, wireless phone, mobile phone, smart phone, e-book, PMP (Portable Multimedia Player), portable game device, navigation device, black box, digital camera, 3-dimensional television, digital audio recorder, digital audio player, digital picture recorder, digital picture player, digital video recorder, digital video player, a device that transceives information in a wireless environment, an electronic device of a home network, an electronic device forming a computing network, an electronic device that forms a telematics network, RFID device, a computing system and the like.

In another embodiment, the semiconductor memory device 100 or memory system 1000 may be mounted with a package of one of various formats. For example, the semiconductor device 100 or memory system 1000 may be packaged in various methods such as a PoP (Package on Package), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP) Wafer-level Fabricated Package (WFP), Wafer-Level Processed Stack Package (WSP) and the like.

Figure 8:
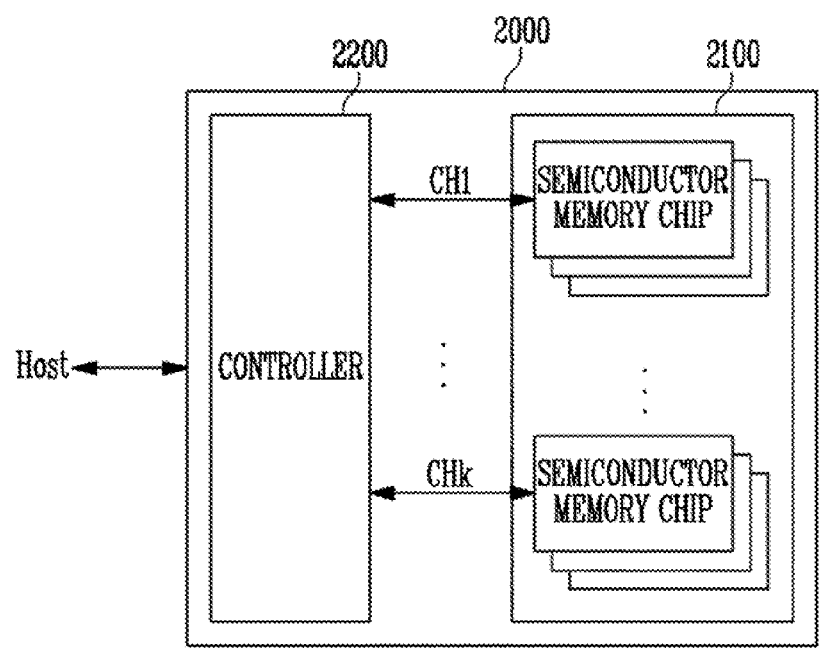
FIG. 8 is a block diagram illustrating an application example of a memory system, according to an embodiment of the present invention.

FIG. 8 is a block diagram illustrating an application example of the memory system of FIG. 7, according to an embodiment of the invention.

Referring to FIG. 8, the memory system 2000 may include a semiconductor memory device 2100 and controller 2200. The semiconductor memory device 2100 may include a plurality of semiconductor memory chips. The plurality of semiconductor memory chips may be divided into a plurality of groups.

As FIG. 8 illustrates each of the plurality of groups may communicate with the controller 220 through a first to $k^{th}$ channels (CH1~CHk). Each semiconductor memory chip may be configured and operated in the same manner as the semiconductor memory device 100 explained with reference to FIG. 1.

Each group may communicate with the controller 2200 through one common channel. The controller 2200 may be configured in the same manner as the controller 1100 explained with reference to FIG. 7, and may also control the plurality of memory chips of the semiconductor memory device 2100 through the plurality of channels (CH1~CHk).

Figure 9:
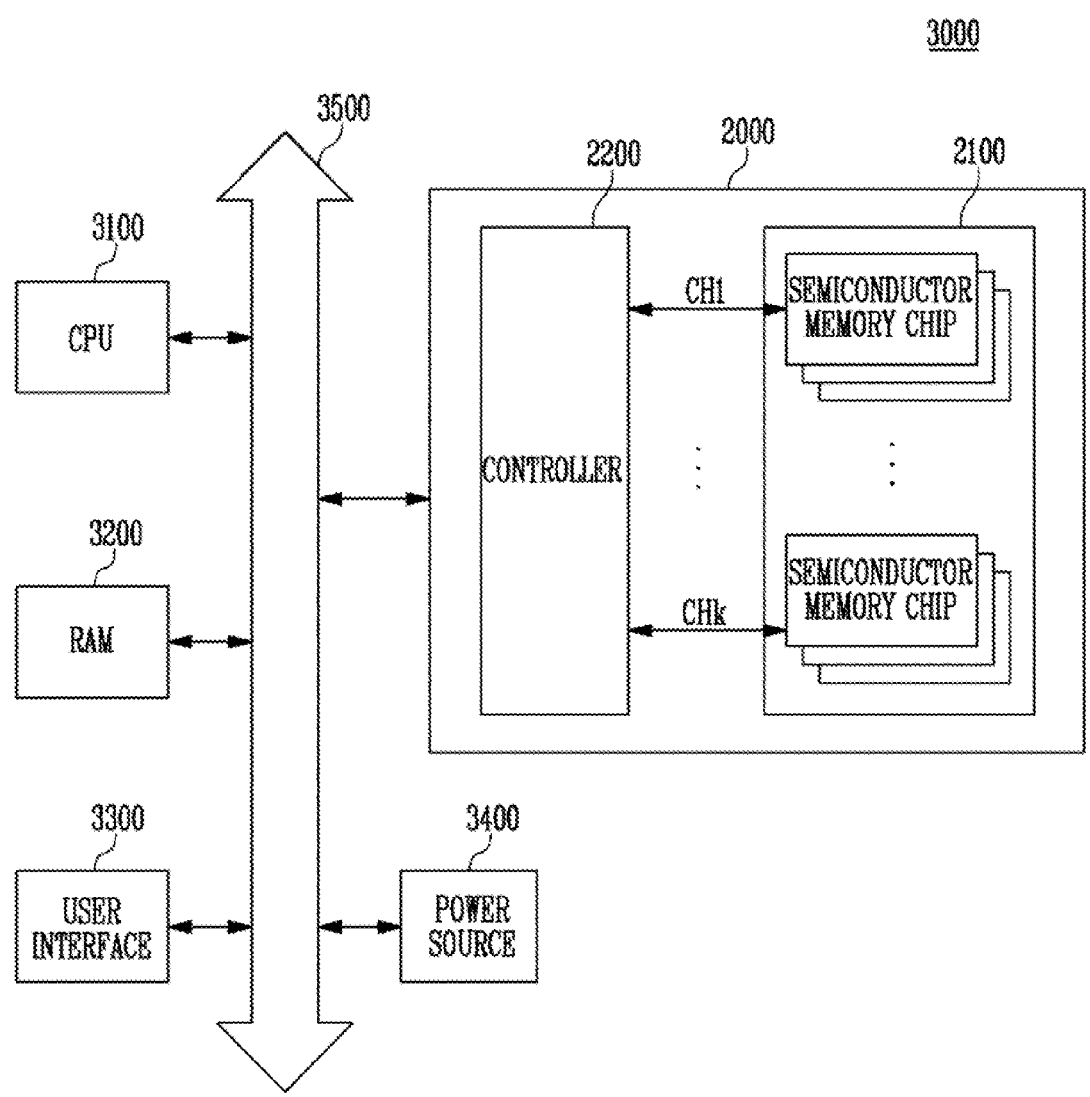
FIG. 9 is a block diagram illustrating a computing system that includes a memory system, according to an embodiment of the present invention.

FIG. 9 is a block diagram illustrating a computing system that includes the memory system explained with reference to FIG. 8, according to an embodiment, of the present invention.

Referring to FIG. 9, the computing system 300 may include CPU 3100, RAM (Random Access Memory) 3200, user interface 3300, power source 3400, system bus 3500, and memory system 2000.

The memory system 2000 may be electrically connected to the CPU 3100, RAM 3200, user interface 3300 and power source 3400 through a system bus 3500. Data provided through the user interface 3300 or processed by the CPU 3100 may be stored in the memory system 2000.

As FIG. 12 illustrates the semiconductor memory device 2100 may be connected to the system bus 3500 through the controller 2200. However, the semiconductor memory device 2100 may be directly connected to the system bus 3500. Herein, the functions of the controller 2200 may be performed by the CPU 3100 and RAM 3200.

In the embodiment shown in FIG. 9, memory system 2000 explained with reference to FIG. 8 is employed. However, it should be understood that memory system 1000 explained with reference to FIG. 7 may also be used. In an embodiment, the computing system 3000 may include all the memory systems 1000, 2000 explained with reference to FIGS. 7 and 8.

The above description of certain embodiments of the invention, should not be construed as limiting the scope of the invention as set forth in the following claims. Therefore, it will be understood by those of ordinary skill in the art that various changes in form and details may be made therein without departing from the spirit and scope of the present invention as defined by the following claims.

What is claimed is:

1. A semiconductor memory device comprising:
   a column address generation circuit suitable for generating contents addressable memory (CAM) column addresses for duplicated CAM data;
   a column selection circuit suitable for allocating columns to the duplicated CAM data according to the CAM column addresses; and
   a plurality of page buffer units, each unit being coupled to a corresponding memory group through the allocated columns, and suitable for storing the duplicated CAM data in the memory groups through the allocated columns;
   wherein a part of the CAM column addresses represent columns which are physically apart by a predetermined number of columns within a memory group.

2. The device according to claim 1, wherein the allocated columns of arranged sequentially within each memory group in a circular order.

3. The device according to claim 1, further comprising an input/output control circuit suitable for generating the duplicated CAM data by duplicating an original CAM data.

4. The device according to claim 1,
   wherein the column address generation circuit comprises:
   a CAM column address counter suitable for generating a CAM column address count signal representing first and second groups of CAM column addresses; and
   a column address generator suitable for generating the CAM column addresses according to the CAM column address count signal;
   wherein each of the first and second groups of CAM column addresses includes the CAM column addresses sequentially increasing and respectively corresponding to the memory groups while the first and second groups of CAM column addresses are separated by the predetermined number of columns.

5. The device according to claim 1, wherein the predetermined number of columns is a one half number of the columns coupled to one of the memory groups.

6. The device according to claim 2,
   wherein the column address generation circuit further generates normal column addresses for normal data pieces, and
   wherein the column selection circuit further allocates the columns to the normal data pieces according to the normal column addresses, and
   wherein the page buffer units further stores the normal data in the memory groups through the allocated columns.

7. The device according to claim 6,
   wherein the column address generation circuit further comprises:
   a normal column address counter suitable for generating a normal column address count signal representing the normal column addresses; and a column address generator suitable for generating the normal column addresses according to the normal column address count signal;

wherein the normal column addresses sequentially increase and respectively correspond to the memory groups in a circular order.

8. The device according to claim 1, further comprising an input/output control circuit for restoring an original CAM data based on buffered values of the duplicated CAM data read from the memory groups according to the CAM column addresses.

9. The device according to claim 8, wherein the input/output control circuit determines a majority value corresponding to the buffered values of the duplicated CAM data and defines the majority value as the value of the original CAM data.

10. The device according to claim 8, wherein the column address generation circuit comprises:

a CAM column address counter suitable for generating a CAM column address count signal representing first and second groups of CAM column addresses; and a column address generator suitable for generating the CAM column addresses according to the CAM column address count signal, and wherein each of the first and second groups of CAM column addresses includes the CAM column addresses sequentially increasing and respectively corresponding to the memory groups while the first and second groups of CAM column addresses are separated by the predetermined number of columns.

11. The device according to claim 8, wherein the predetermined number of columns is a one half number of the columns coupled to one of the memory groups.

12. An operating method for a semiconductor memory device including a plurality of page buffer units each unit corresponding to a memory group of a plurality of memory groups through columns the method comprising:

generating contents addressable memory (CAM) column addresses for duplicated CAM data pieces;

allocating the columns to the duplicated CAM data pieces according to the CAM column addresses; and storing duplicated CAM data pieces in the memory groups through the allocated columns, wherein each of the page buffer units is coupled to a corresponding memory group via the allocated columns which are sequentially allocated to each memory group in a circular order; and wherein a part of the CAM column addresses corresponding to one of the memory groups represent allocated columns which are physically apart by a predetermined number of columns from one another among the columns.

13. The method according to claim 12, further comprising generating the duplicated CAM data pieces by duplicating an original CAM data.

14. The method according to claim 12, wherein the generating of the CAM column addresses for the CAM data pieces comprises:

generating a CAM column address count signal representing first and second groups of CAM column addresses; and generating the CAM column addresses according to the CAM column address count signal, and wherein each of the first and second groups of CAM column addresses includes the CAM column addresses sequentially increasing and respectively corresponding to the memory groups while the first and second groups of CAM column addresses are separated by the predetermined number of columns.

15. The method according to claim 12, wherein the predetermined number of columns is a half number of the columns coupled to one of the memory groups.

16. The method according to claim 12, further comprising:

generating normal column addresses for normal data pieces;

allocating the columns to the normal data pieces according to the normal column addresses; and storing the normal data pieces in the memory groups through the allocated columns.

17. The method according to claim 16, wherein the generating of the normal column addresses for the normal data pieces comprises:

generating a normal column address count signal representing the normal column addresses; and generating the normal column addresses according to the normal column address count signal, and wherein the normal column addresses sequentially increase and respectively correspond to the memory groups in circular order.

18. The method according to claim 12, further comprising:

buffering values of the duplicated CAM data pieces read from the memory groups according to the CAM column addresses; and restoring an original CAM data based on the buffered values of the duplicated CAM data pieces.

19. The method according to claim 18, wherein the restoring of the original CAM data determines a majority value for the buffered values of the duplicated CAM data and sets the majority value as the value of the original CAM data.

20. The method according to claim 18, wherein the generating of the CAM column addresses for the CAM data pieces comprises:

generating a CAM column address count signal representing first and second groups of CAM column addresses; and generating the CAM column addresses according to the CAM column address count signal, and wherein each of the first and second groups of CAM column addresses includes the CAM column addresses sequentially increasing and respectively corresponding to the memory groups while the first and second groups of CAM column addresses are separated by the predetermined number of columns.

* * * * *